US 6,639,276 B2

(12) United States Patent
Spring et al.

(10) Patent No.: US 6,639,276 B2
(45) Date of Patent: Oct. 28, 2003

(54) POWER MOSFET WITH ULTRA-DEEP BASE AND REDUCED ON RESISTANCE

(75) Inventors: Kyle Spring, Temecula, CA (US); Jianjun Cao, Temecula, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/187,580

(22) Filed: Jul. 1, 2002

(65) Prior Publication Data

US 2003/0020115 A1 Jan. 30, 2003

Related U.S. Application Data

(60) Provisional application No. 60/303,059, filed on Jul. 5, 2001.

(51) Int. Cl.$^7$ .................. H01L 31/113; H01L 21/336
(52) U.S. Cl. .............. 257/341; 257/344; 257/401; 257/500; 438/197
(58) Field of Search .................. 257/341, 335, 257/401, 500, 501, 502, 578, 344; 438/197, 284, 286, 370, 394

(56) References Cited

U.S. PATENT DOCUMENTS

| | | | |
|---|---|---|---|
| 5,981,998 A | * 11/1999 | Frisina et al. ............... 257/339 |
| 5,985,721 A | * 11/1999 | Frisina et al. ............... 438/268 |
| 6,008,520 A | 12/1999 | Darwish et al. ............. 257/330 |
| 6,380,569 B1 | 4/2002 | Chang et al. ............... 257/256 |
| 6,468,866 B2 | * 10/2002 | Frisina et al. ............... 438/268 |

FOREIGN PATENT DOCUMENTS

EP 1113501 A2 7/2001

* cited by examiner

*Primary Examiner*—Hoai Ho
*Assistant Examiner*—Long Tran
(74) *Attorney, Agent, or Firm*—Ostrolenk, Faber, Gerb & Soffen, LLP

(57) ABSTRACT

A power semiconductor device formed of a substrate of a first conductivity type, an epitaxial layer of a first conductivity type formed on a surface of the substrate, a plurality of lightly doped spaced base regions of a second conductivity type formed to a first predetermined depth in the epitaxial layer with common conduction regions between the base regions, a plurality of highly doped source regions of the first conductivity type formed in the lightly doped base regions, invertible channel regions disposed between the source regions and the common conduction regions, deep implanted junctions of the second conductivity type formed in the epitaxial layer under the base regions extending between the first predetermined depth and a second predetermined depth, gate electrodes insulated from the invertible channels by an insulation layer formed over the invertible channels, and thick insulation spacers disposed over at least a portion of the common conduction regions.

11 Claims, 14 Drawing Sheets

POWER MOSFET WITH ULTRA-DEEP BASE AND REDUCED ON RESISTANCE

RELATED APPLICATION

The application is based on and claims benefit of U.S. Provisional Application No. 60/303,059, filed Jul. 5, 2001, entitled Power MOSFET With Ultra-Deep Base and Reduced On Resistance, to which a claim of priority is made.

FIELD OF THE INVENTION

This invention relates to power MOSFETs and processes for their manufacture, and more specifically relates to a novel MOSFET having increased breakdown voltage, and higher concentration of dopants in the drift region producing a reduced on-resistance and die area reduction for a given rating.

BACKGROUND OF THE INVENTION

Power MOSFETs are well known semiconductor devices. Two competing operational characteristics of power MOSFETs are the breakdown voltage and the Rdson (on resistance). Another operational characteristic of a power MOSFET that is important is its switching frequency. It is generally desirable to have a power MOSFET with high breakdown voltage, low Rdson, and a high switching frequency capability. It is also desired to have a power MOSFET having the foregoing characteristics and, in a cellular device, a high cell density in order to reduce the size of the device.

FIG. 1 shows the structure of a well known vertical conduction power MOSFET. The well-known device shown in FIG. 1 employs a silicon substrate 30 having a junction-receiving epitaxial layer 31 grown on the top surface thereof. A plurality of source regions 33 of the same conductivity as epitaxial layer 31 and substrate 30 are provided in base regions 32 of the opposite conductivity type. Invertible channels 32' are disposed between source regions 33 and common conduction regions 35.

A thin gate oxide 34 overlies the invertible channels 32' and the top of the common conduction regions 35. A conductive polysilicon layer 36 overlies the gate oxide layers 34 and is insulated by a low temperature oxide layer 37. The polysilicon layer 36 serves as the gate electrode structure for creating the electric field that is required to invert the invertible channels 32' in order to electrically link the source regions 33 to the common conduction regions 35. Oxide spacers 38 are also formed on the sidewalls of the polysilicon layer 36. Oxide spacers 38 and low temperature oxide layer 37 electrically insulate the polysilicon layer 36 from the contact layer 39 which is electrically connected to the source regions 33 and serves as a contact for the same. Aluminum or some other suitable metal can be used to form the contact layer 39. It is noteworthy that in the device shown in FIG. 1 contact layer 39 extends through a depression in the source regions 33 to make contact with the base regions 32, thus shorting the source regions 33 and the base regions 32, thereby preventing the operation of the parasitic bipolar transistor in the body of the device. In a vertical conduction MOSFET such as the one shown in FIG. 1 the bottom free surface of the substrate 30 is also metallized to serve as the drain contact for the device.

The device shown in FIG. 1 is an N channel MOSFET. In this device, the base regions 32 are lightly doped with a P type dopant such as boron, while the source regions 33 are highly doped with an N type dopant such as phosphorous; the epitaxial layer 31 (or drift region) is lightly doped with an N type dopant such as phosphorous, and the substrate 30 is highly doped with an N type dopant such as phosphorous. A P channel MOSFET may be devised using the same structure as that shown in FIG. 1 but using the opposite conductivities as that shown in FIG. 1 in every region.

When a positive voltage of sufficient strength is applied to the polysilicon layer 36, an electric field is created, which field begins to deplete the invertible channels. When the channels are sufficiently depleted, the invertible channels are inverted and an N channel is formed between the source regions 33 and the common conduction regions 35. A voltage between the source regions 33 and the drain at the bottom of the device will cause a current to flow between the two.

The lightly doped region in the epitaxial layer 31 is often referred to as the drift region. In the conventional MOSFET shown by FIG. 1, this region is lightly doped in order to increase the breakdown voltage of the device. Because it is lightly doped, the drift region significantly contributes to the Rdson of the device. Hence, in conventional MOSFETs a balance must be struck between the desired breakdown voltage and the Rdson in that an improvement in one obtained by varying the concentration of dopants in the drift region adversely affects the other.

Superjunction devices are known. These device include highly doped columns or pylons usually formed under the base regions. The drift region in superjunction devices is also highly doped and has a charge that is equal to that of the highly doped pylons or columns. Due to the increase in the concentration of dopants in the drift region the Rdson of a superjunction device is less than other devices. However, the breakdown voltage of a superjunction device is not compromised due to the increase in the concentration of dopants in the drift region in that the highly doped columns or pylons cause the lateral depletion of the drift region under the reverse voltage condition thereby improving breakdown capability in the device.

A schematic of such a structure, which is often referred to as a superjunction structure is shown in FIG. 2. Referring to FIG. 2, highly doped pylons or columns 32" are formed under the body regions 32. To take advantage of the characteristics of a superjunction charge balance must be struck between the pylons 32" and the areas surrounding the highly doped pylons 32". Thus, the concentration of the dopants in the drift region is increased to match those of the pylons 32". The increase in the concentration of dopants in the drift regions reduces the Rdson of the device. However, as shown in FIG. 2, the increase in the dopant concentration does not reduce the breakdown voltage in that the pylons 32" operate to deplete the drift region between the pylons for the length of the of the pylons thereby improving the breakdown voltage of the device. As a result, a device is obtained that has a low Rdson and a high breakdown voltage.

As explained above, to reduce the $R_{DSON}$ while keeping the breakdown voltage high, deep pylons or columns 32" of one of the conductivity types are formed in the drift region of the device. The formation of pylons or columns 32" requires many epitaxial depositions each followed by a diffusion drive. Such a process may require many masking steps which further complicate the manufacturing of the superjunction devices. Thus the manufacturing of conventionally known superjunction devices can be a time consuming and therefore expensive process.

The frequency response of a MOSFET is limited by the charging and the discharging of its input capacitance. The input capacitance of a MOSFET is the sum of the gate to drain capacitance (Cgd) and the gate to source capacitance (Cgs). As the Cgd and the Cgs become smaller the MOSFET can operate in a higher frequency range. Thus, it is desirable to have lower input capacitance in order to improve the frequency response of a MOSFET.

BRIEF DESCRIPTION OF THE INVENTION

In accordance with the present invention, deep implanted junctions are provided under the base regions in the drift region which itself may be highly doped and may have a substantially equal charge to the deep implanted junctions. By providing deep implanted junctions in a highly doped drift region the resistivity of the drift region may be reduced without sacrificing the breakdown voltage of the device.

According to an aspect of the present invention, prior to the formation of the MOSgate channel region, deep implanted junctions are formed by one or a plurality of early implants at 5E11 TO 1E14 atoms/cm$^2$ (for example, boron for a P channel device) and at an energy of 150 KeV to 4 MeV. This process obviates the need for multiple epitaxial depositions to form a plurality of pylons or columns as is required by the prior art devices. More importantly, implants may be carried out during the same masking step thus reducing the number of masks required.

According to another aspect of the present invention, a device according to the present invention includes a drastically thickened oxide disposed above the drift region (or "common conduction region"), which reduces the spacing between the polysilicon gate and the drain surfaces over a substantial portion of their opposing areas, thus reducing the capacitance between the gate to the drain substantially. Also, the ratio of $Q_{GD}/Q_{GS}$ is substantially reduced, which results in excellent Cdv/dt immunity.

DETAILED DESCRIPTION OF THE PREFERRED EMBODIMENTS

Figure 1:
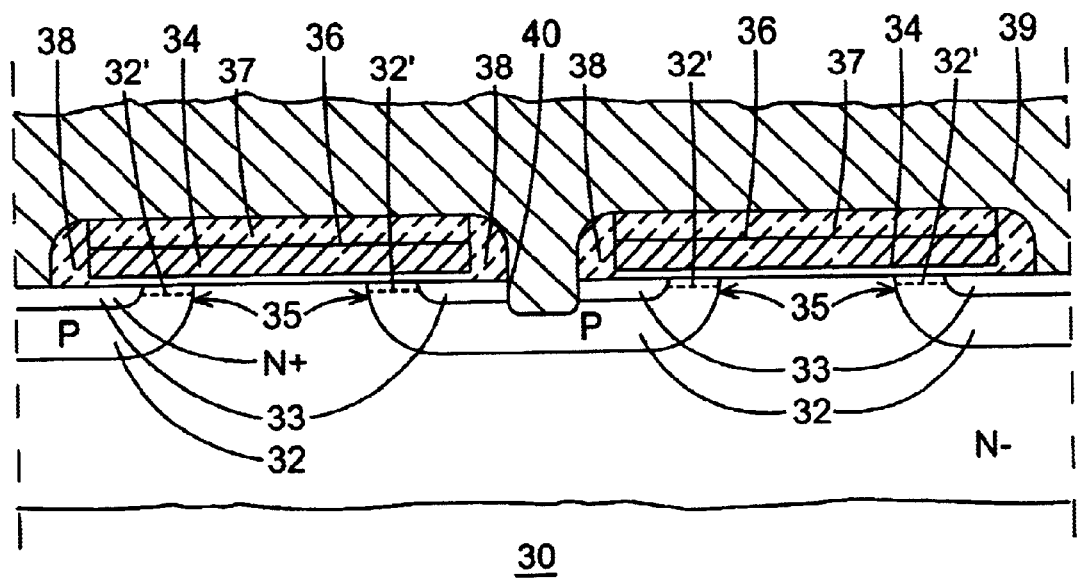
FIG. 1 shows a cross-sectional view of a small portion of a vertical conduction MOSFET according to prior art.
Figure 2:
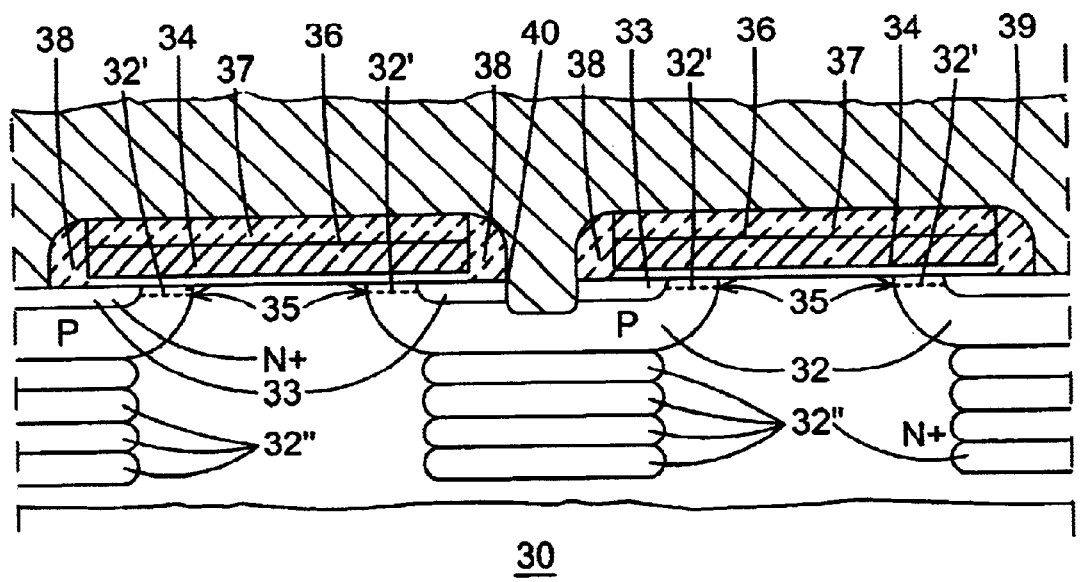
FIG. 2 shows a MOSFET device according to prior art.
Figure 3:
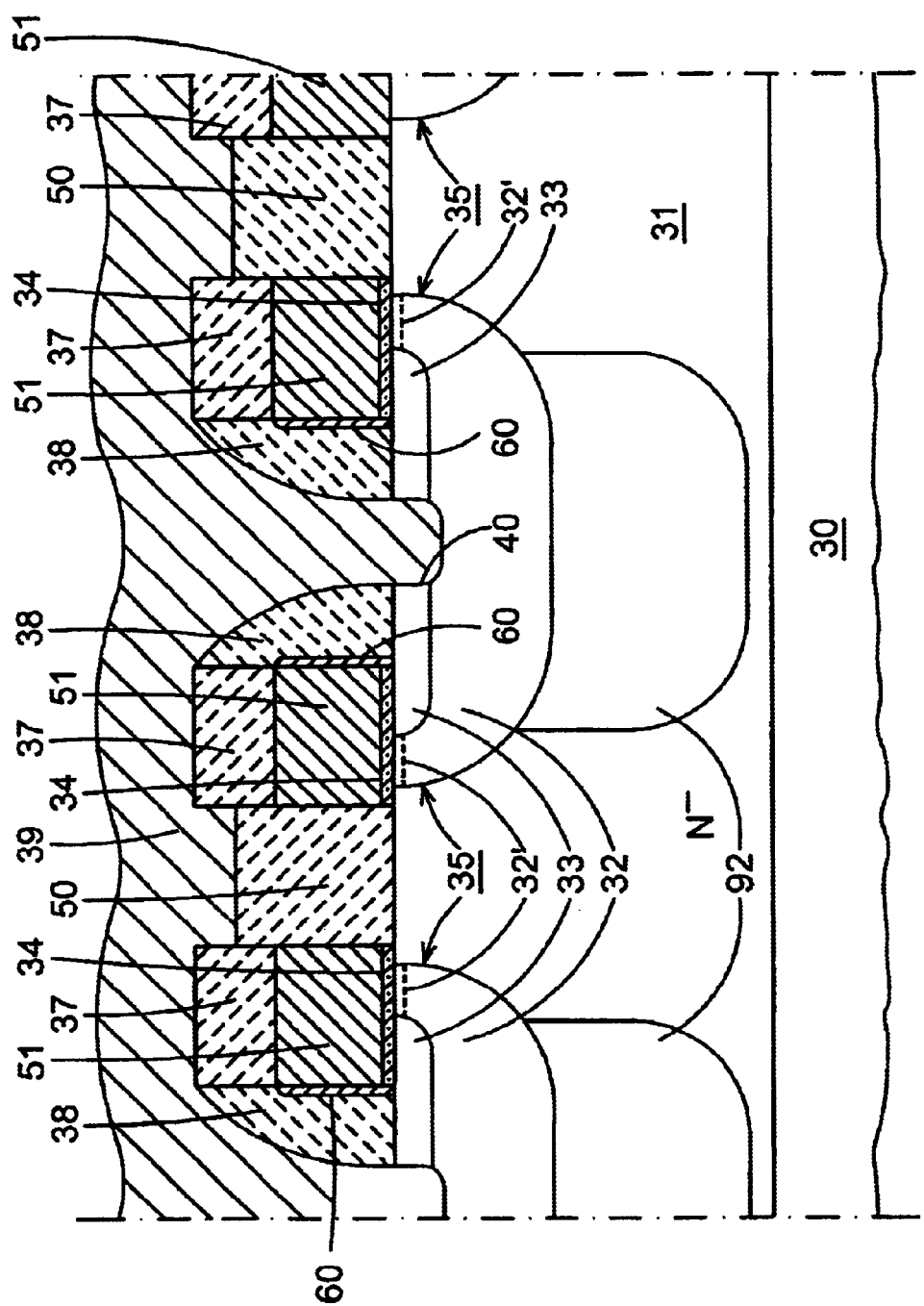
FIG. 3 shows a MOSFET according to the present invention.

A cross-sectional view of a MOSFET according to the present invention is shown in FIG. 3. Referring to FIG. 3, in which like numerals identify the same features as those described above, a MOSFET according to the present invention is comprised of a highly doped semiconductor substrate 30, which may be a mono crystalline silicon substrate or some other semiconductive material, a lightly doped epitaxial layer 31, highly doped source regions 33 of the same conductivity as the epitaxial layer 31 formed in respective lightly doped body regions 32 of an opposite conductivity type. The MOSFET shown by FIG. 3 also includes gate insulation layers 34 formed over invertible channels 32'. However, unlike the prior art device shown in FIG. 1, the gate insulation layers 34 do not extend over the entire area of common conduction regions 35, which are located between the body regions 32. Rather, the gate insulation layers only extend over a portion of the common conduction regions 35. The remaining portion of the common conduction regions 35 which are not covered by the gate insulation layers 34 are covered by insulation spacers 50.

As shown in FIG. 3, gate electrodes 51, which are typically made from polysilicon, are formed over gate insulation layers 34. According to one aspect of the invention, insulation spacers 50 are disposed between the gate electrodes 51. The insulation spacers 50 make contact with the top surface of the epitaxial layer 31 and cover a substantial portion of each common conduction region 35. A source contact 39, which may be made from aluminum, is provided to make contact with the source regions 33 and body regions 32. Insulating sidewalls 38 and insulating top layers 37 are interposed between the gate electrodes 51 and the source contact 39 in order to insulate the two from one another. Optionally, silicide walls 80 are interposed between sidewalls 38 and the gate electrodes 51.

Insulating spacers 50 are drastically thickened and preferably expand over a substantial portion of the width of common conduction regions 35. For example, insulating spacers 50 can have a height of about 0.5μ, which is drastically larger than the thickness of gate oxide 34 (less than 1000 Å). Also, the width of the insulating spacer 50 can be at least more than one-half of the width of the common conduction regions 35.

It can be seen in FIG. 3 that the insulating spacers 50 reduce the area of the gate electrodes 51 overlying the surface of common conduction regions 35. This results in a much reduced gate to drain capacitance. As a result the input capacitance of the device is greatly improved, thereby improving the frequency response of the same.

Referring again to FIG. 3, a MOSFET according to the present invention includes deep implanted junctions 92 formed in the body of the epitaxial layer 31. In accordance with an aspect of the invention, the deep implanted junctions 92 may be at least double the depth of body regions 32 and are preferably almost as deep as the full depth of epitaxial layer 31. The concentration of dopants in deep implanted junctions 92 may be increased. An increase in the dopant concentration of deep implanted junctions 92 allows for an increase in the dopant concentration of the common conduction region 35, which improves Rdson without sacrificing the breakdown voltage. It has been found that the resistance per area (sheet resistance) in a device according to the present invention is reduced by more than one half that of a conventional device, thus permitting a reduction in the size of the device.

The device shown in FIG. 3 is an N channel device and thus includes highly doped N type source regions 33, lightly doped P type body regions 32, an N type epitaxial layer and an N type substrate. The deep implanted junctions 92 of the device shown in FIG. 3 may be highly doped P type regions. A P channel MOSFET according to the invention is also possible by reversing the polarity of each of the regions of the N channel device discussed herein.

A MOSFET according to the present invention can be manufactured according to the process described below.

Figure 4:
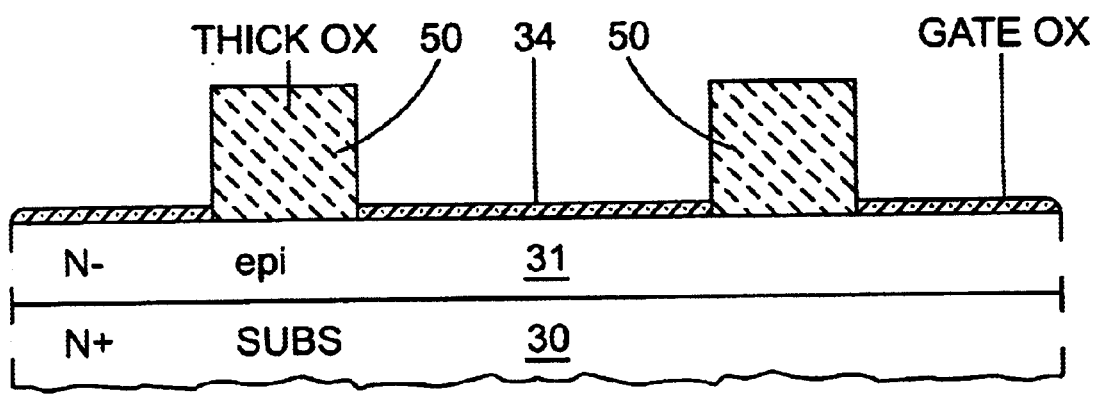
FIGS. 4–13 show the various steps taken in producing a semiconductor device according to the present invention.

First, a doped substrate 30, which may be a highly doped N type monocrystaline silicon wafer, having a doped epitaxial layer of silicon disposed on a top surface thereof is provided. Referring now to FIG. 4, a thick insulating layer, which may be an insulating oxide, is deposited or grown on the upper surface of the epitaxial layer 31. For example, the thick insulating layer may be 0.5 microns thick. The thick insulating layer is then patterned and etched, leaving insulating spacers 50. Then a thin gate oxide layer 34 is grown on the surface of the epitaxial layer 31 that is exposed between the insulating spacers 50.

Figure 5:
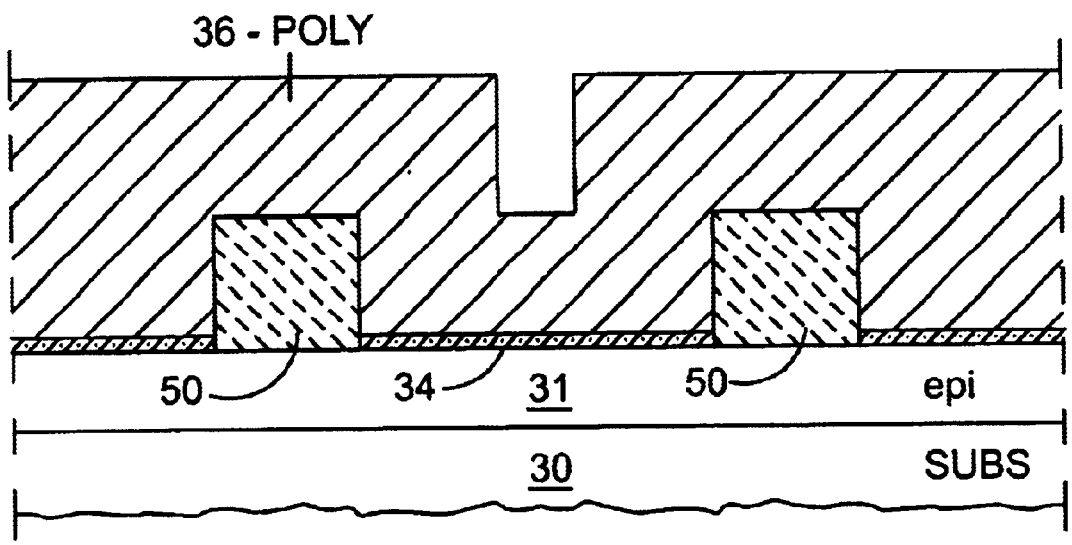

Thereafter, as shown in FIG. 5, a layer of gate material 36 such as polysilicon is deposited over the top surface of the structure shown in FIG. 4. The gate material is then doped to make it conductive. For example, if polysilicon is used as the gate material it is doped with an N type dopant. The doping process may then be followed with a diffusion drive to activate the dopants.

Figure 6:
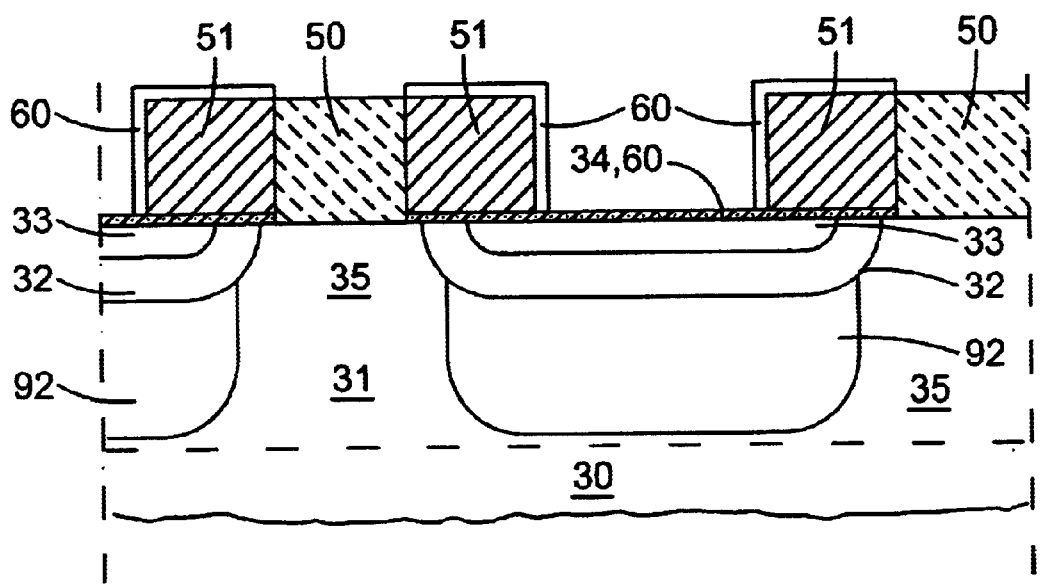

After the diffusion drive, the top surface is deglassed and, as shown in FIG. 6, the polysilicon is patterned and etched to define separated gate electrodes 51 on the sides of the insulating spacers 50.

Body regions 32 and source regions 33 are then implanted using the conventionally known technique of double diffusion to provide shallow base regions 32 and self-aligned source regions 33 using the gate electrodes 51 as masks. Then, the body regions 32 and source regions 33 are diffused. During the diffusion drive, a thin oxide layer 60 (source oxide) grows over the polysilicon spacers 51. Then, according to another aspect of the present invention, P type dopants are implanted into the epitaxial layer to form the deep implanted junctions 92. To form the deep implanted junctions 92 one or more implants of a P type dopant such as boron may be required to form the deep implanted junctions 92. Each implant can be carried out at an energy of between 150 keV to 4 MeV at a dose of about 5E11 to 1E14. As a result, deep implanted junctions 92 are formed under the body regions 32. It is noteworthy that multiple masking is not required in that the implants can be carried out without remasking, thus making the process more efficient.

Figure 7:
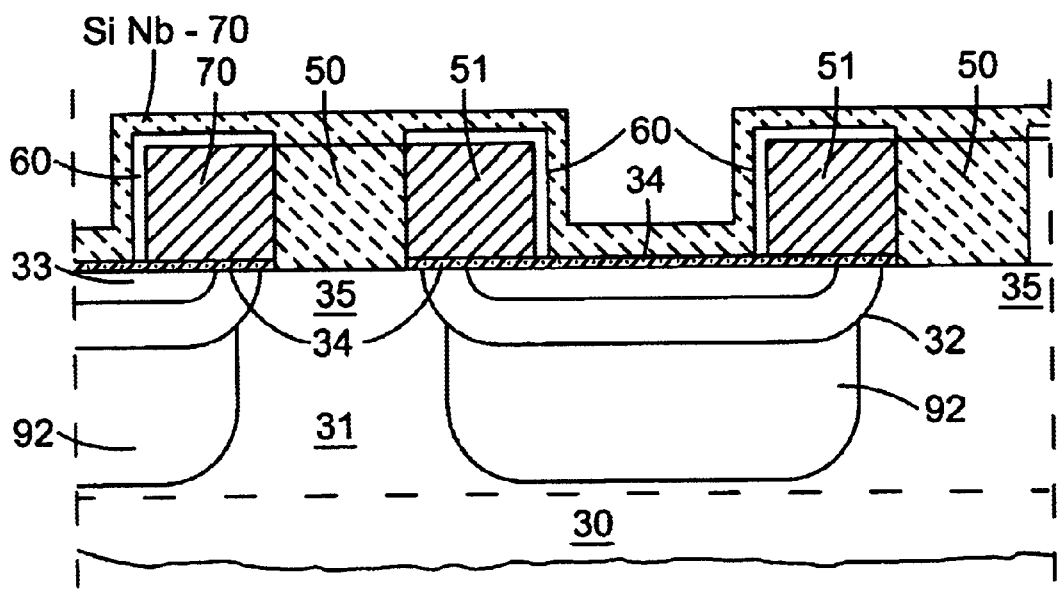
Figure 8:
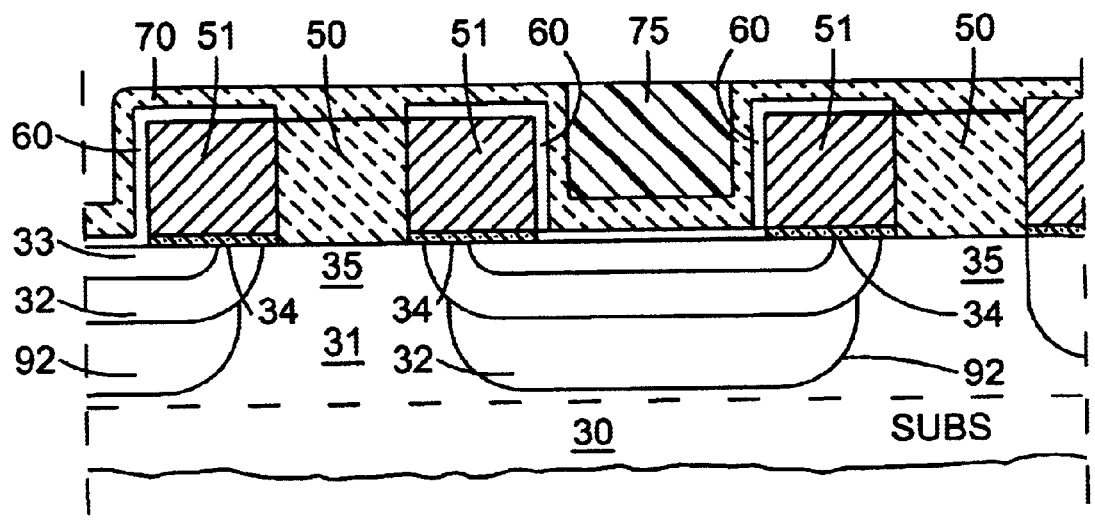

Referring to FIG. 7 next, a thin oxidation blocking layer 70, which may be a nitride is deposited atop and over the oxide layer 60. The gap above the central portion of the source regions 33 is then filled with an etch protectant, such as a photoresist 75 (FIG. 8) and the upper surface receives a short etch to remove excess photoresist.

Figure 9:
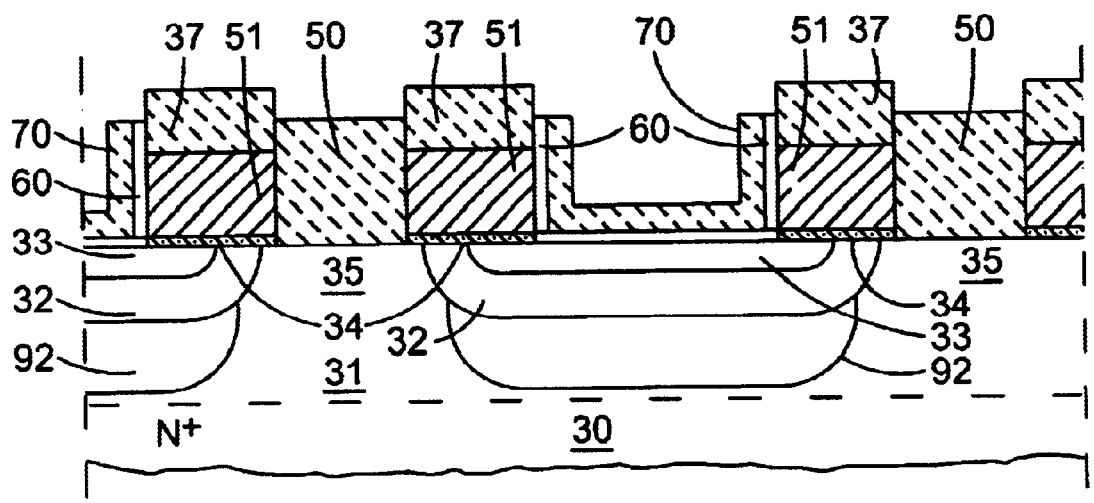
Figure 10:
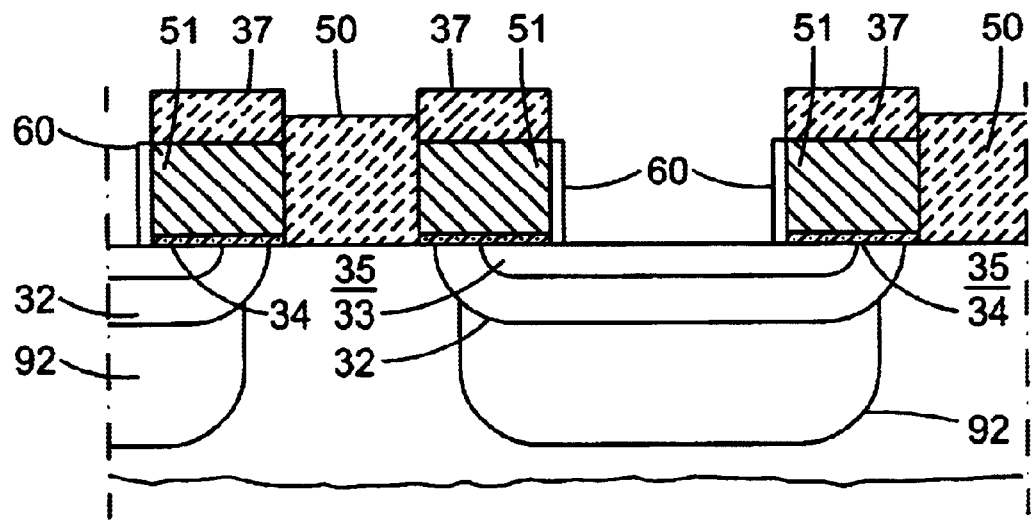

Thereafter, and as shown in FIG. 9, the exposed upper layer of nitride 70 is etched and the photoresist 75 is stripped off. An insulating layer 37, which may be an oxide, is then grown atop the gate electrodes 51. The remaining nitride film 70 (or the like) is then stripped off as shown in FIG. 10.

Figure 11:
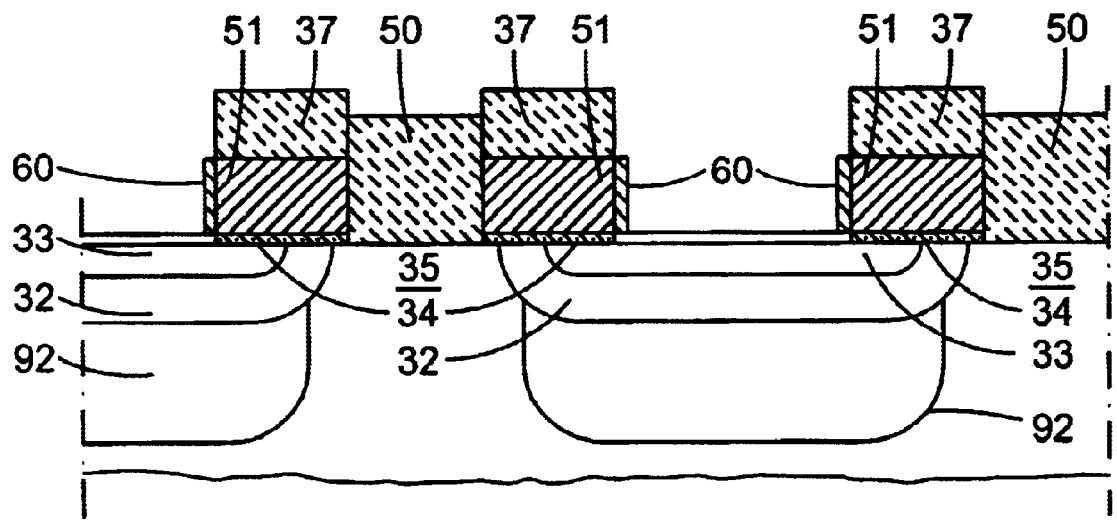

As an option to reduce the resistance $R_G$ of the gate electrodes, polysilicide walls 80 may be formed on the sides of the gate electrodes 51 as shown in FIG. 11. In this process, the gap between adjacent gate electrodes 51 is partially filled with an etch protectant, for example, a photoresist, to cover the horizontal oxide surface, but having most of the vertical side walls of gate electrodes 51 unprotected. A short etch is then carried out to remove the oxide 60 on the sidewalls of the gate electrodes 51 and the photoresist is stripped. The layer 80, for example, of WSi or the like is then formed on the bare sidewalls of gate electrodes 51.

Figure 12:
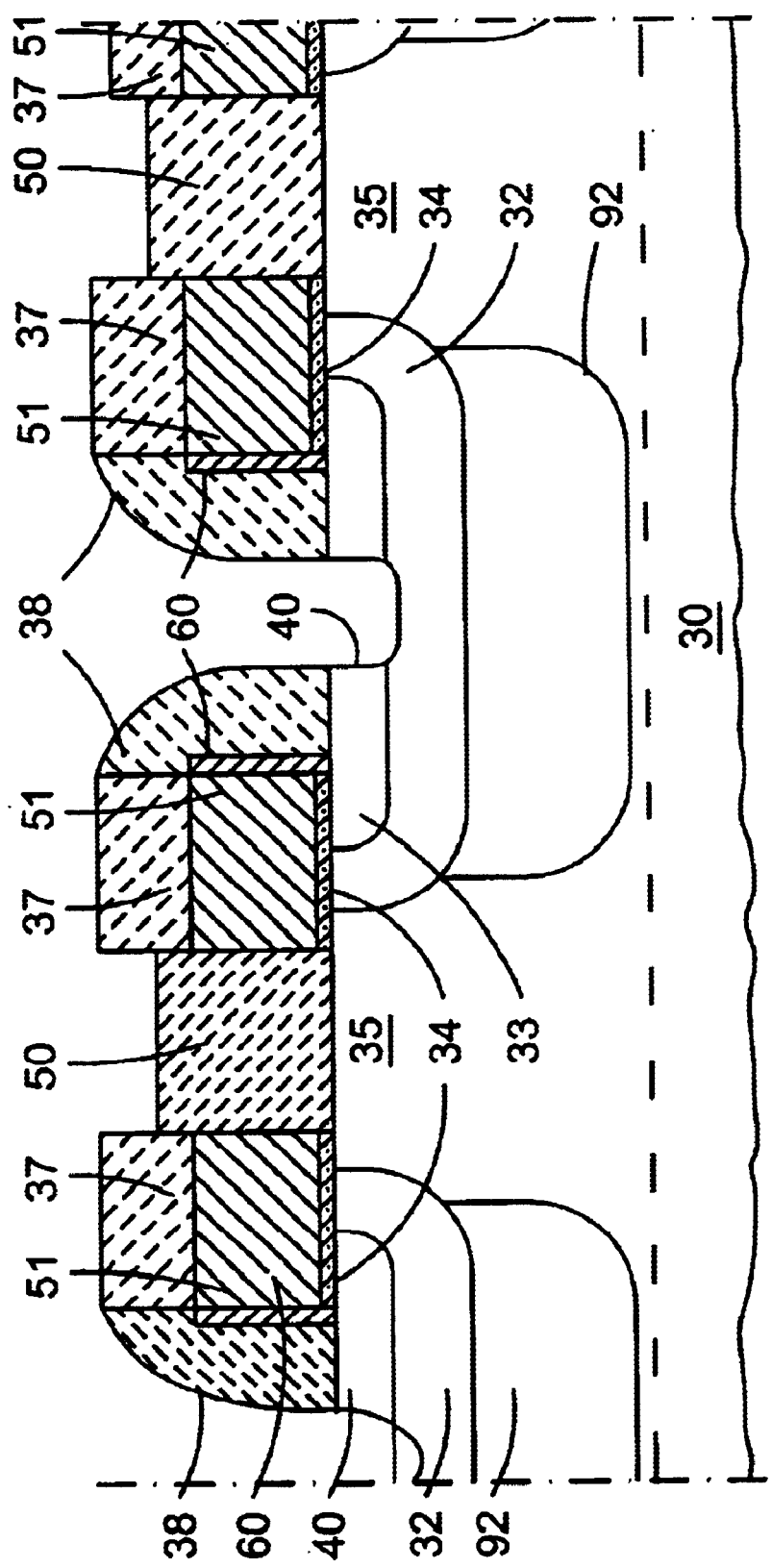

Thereafter, the self-aligned contact process is carried out, in which a conformal oxide layer is deposited atop the die surface and is patterned and etched by a planar oxide etch back step to leave the insulating sidewalls 38 in place as shown in FIG. 12. A silicon trench etch is then carried out to form trenches 40.

Figure 13:
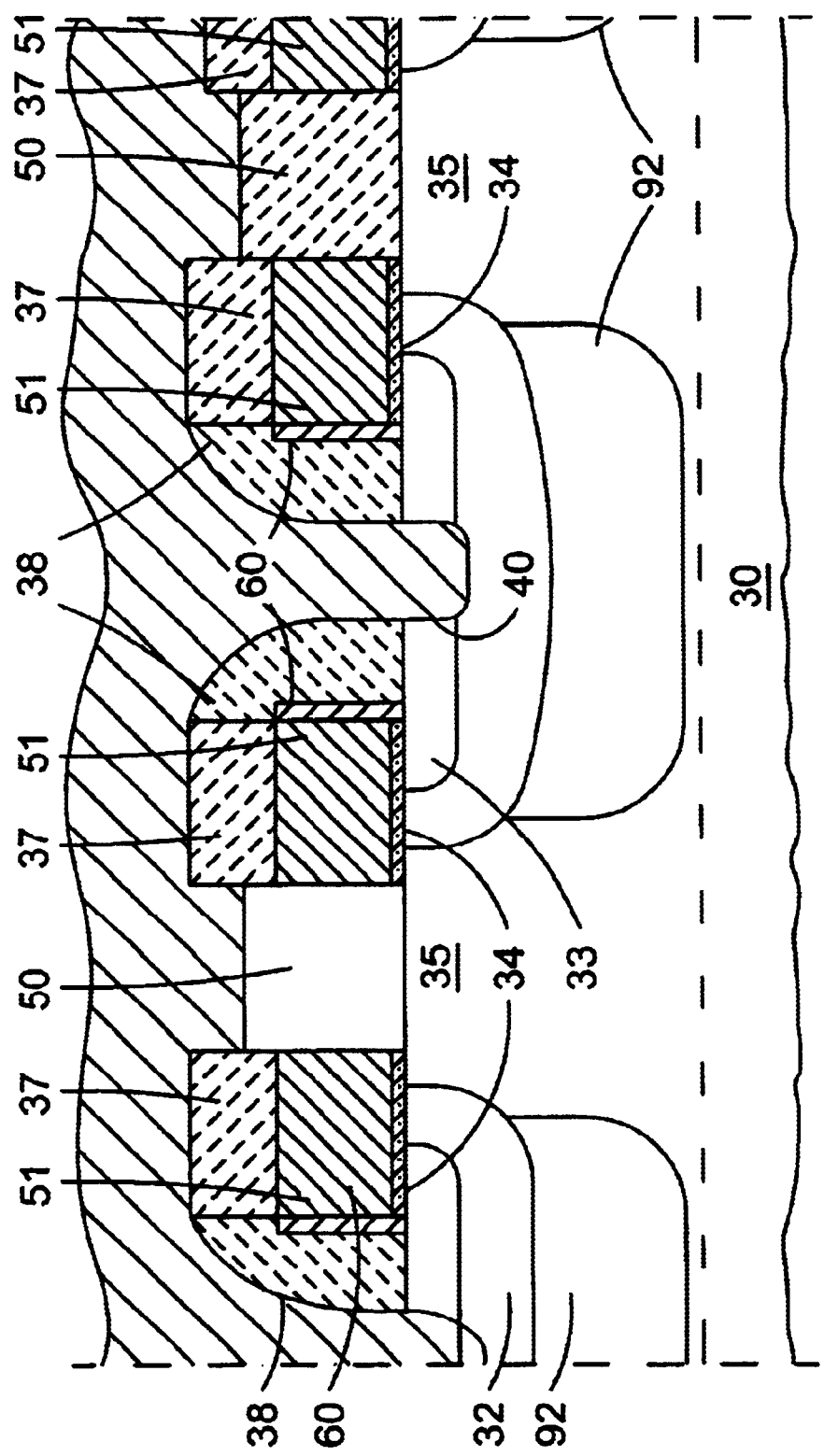

The device top surface is then patterned and etched to form a polygate contact and the photoresist is again removed. A short oxide etch is then carried out and a metal contact layer 39 such as a layer of aluminum is then deposited atop the wafer as shown in FIG. 13. This contact is then appropriately patterned as desired.

Figure 14:
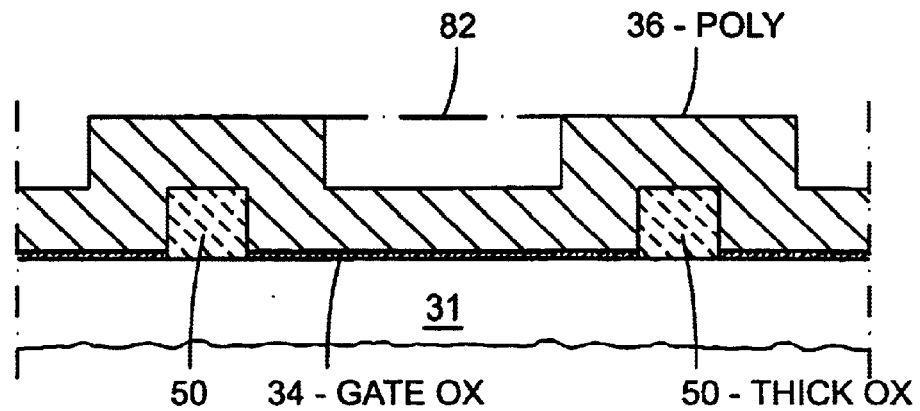
FIGS. 14A–14C show steps for producing another device according to a second embodiment of the present invention.
Figure 14:
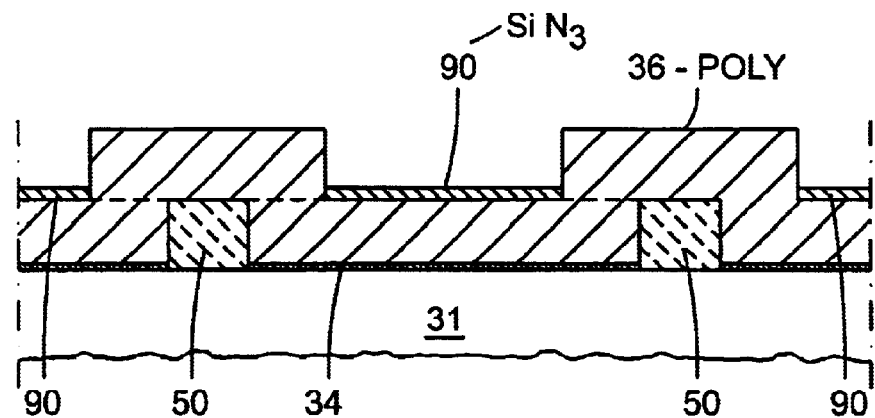
Figure 14:
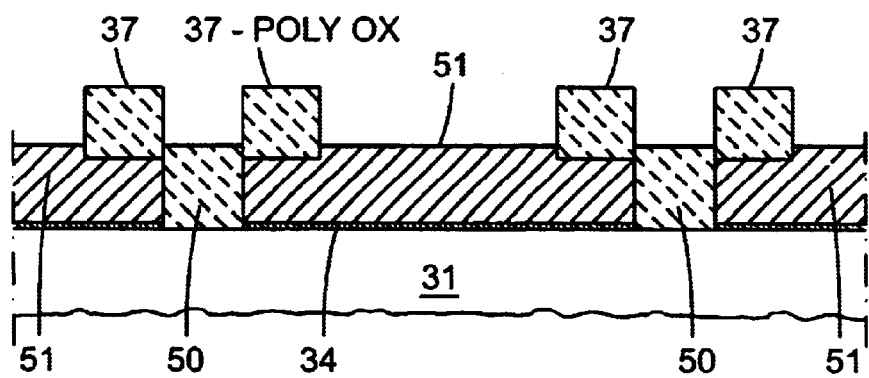
Figure 16:
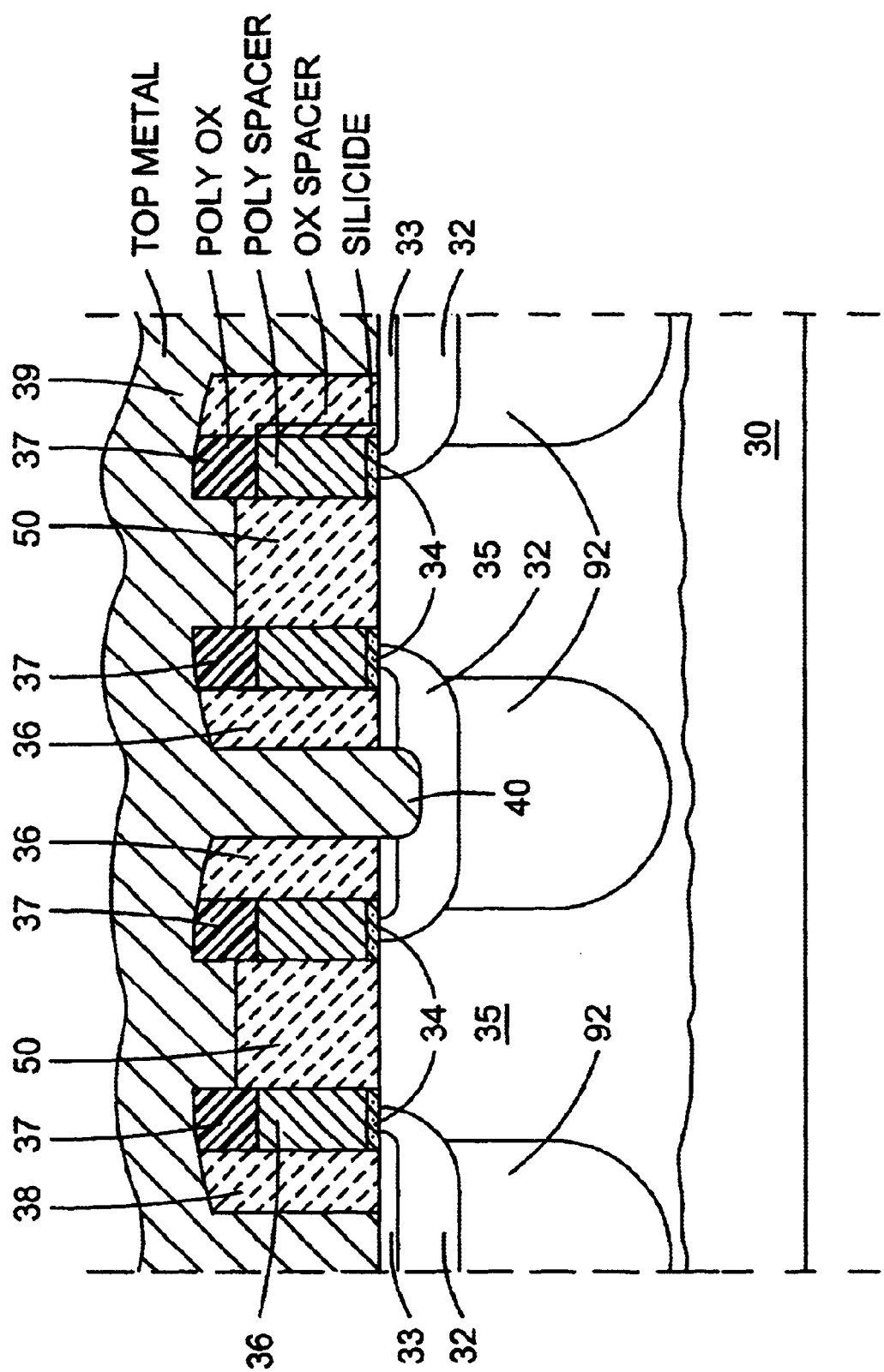
FIG. 16 shows a cross-sectional view of a device according to a second embodiment of the present invention.

FIGS. 14A to 14C show a modified process flow in which the gate electrodes 51 are formed by protecting the polysilicon "valleys" 82 with an oxidation blocking film such as $SiN_3$ (FIG. 14B), and then etching the polysilicon and oxidizing, thereby consuming the etched polysilicon. FIG. 14A shows the silicon substrate 30 after formation of epitaxial layer 31, insulation spacers 50 and polysilicon layer 36. (See FIG. 5). Referring to FIG. 14B, a layer of nitride 90, or the like is then formed. The gaps are filled with a protectant such as a photoresist and the nitride which is exposed is etched and the resist is stripped. The exposed polysilicon mesas are then etched to the level of the insulation spacers 50 and polyoxide layers 37 are grown atop the etched surface of the polysilicon layer 51. The nitride 90 is then stripped and the polysilicon is etched and the process is completed as shown in FIGS. 6–13. A device according to the second embodiment which is produced according to the modified process shown by FIGS. 14A–14C is shown in FIG. 16.

Figure 15:
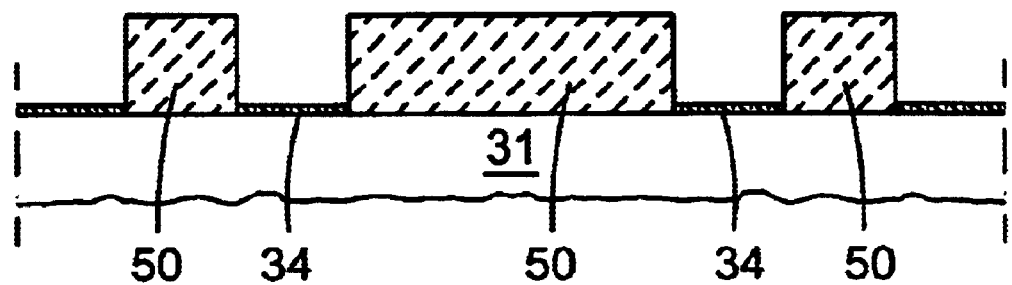
FIGS. 15A–15D show alternative steps for producing a device according to the present invention.
Figure 15:
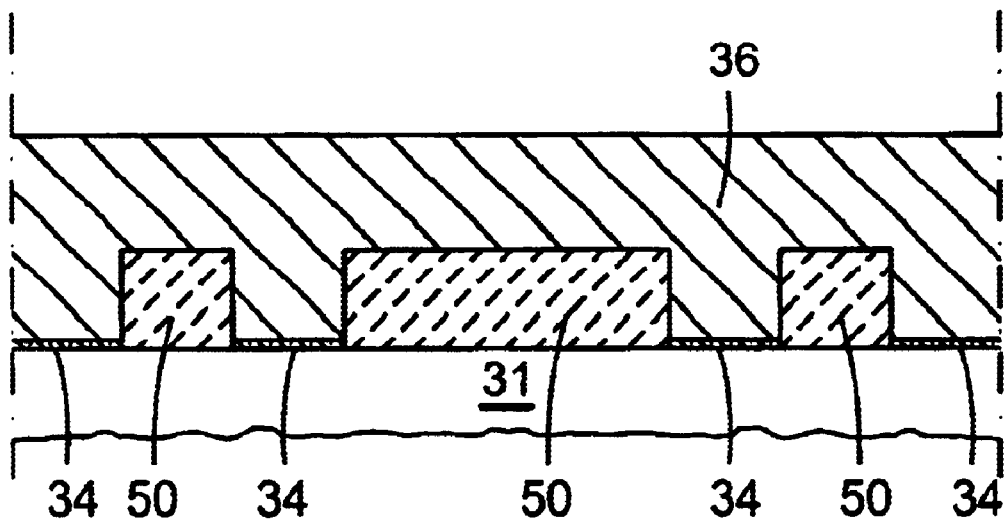
Figure 15:
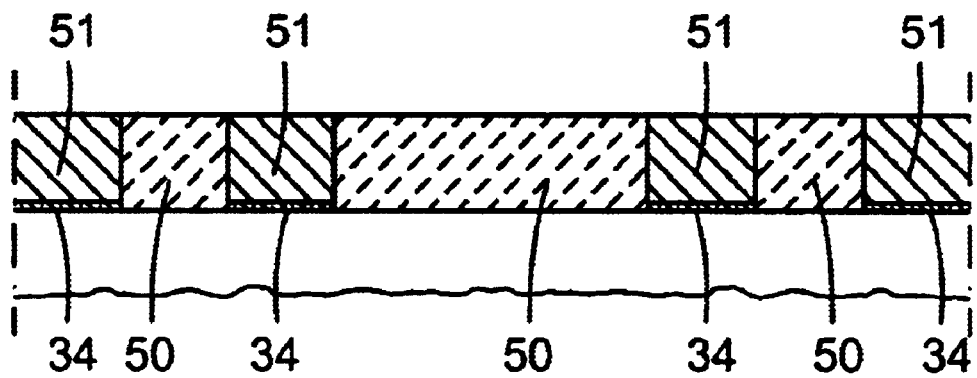
Figure 15:
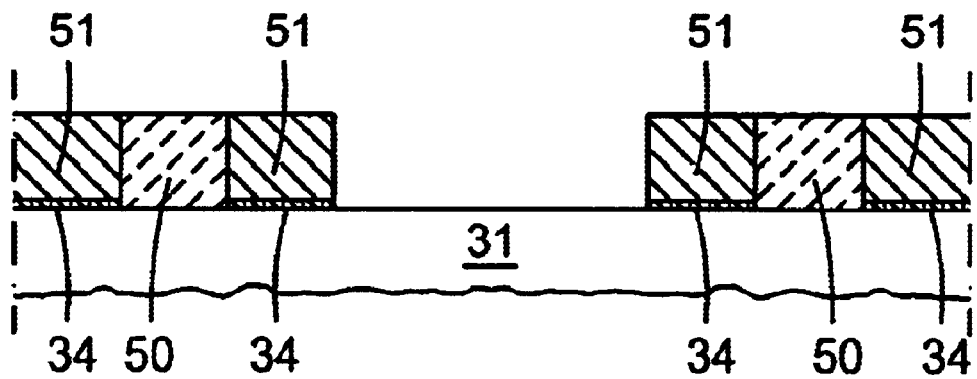

FIGS. 15A to 15D show a still further modified process flow in which the starting thick oxide layer 50 is originally patterned as shown in FIG. 15A to define dual polysilicon gates 51 and cells. A gate oxide 34 is then grown and a polysilicon layer 36 is formed to fill the gaps between oxide spacers 50 as shown in FIG. 15B. A planar etch back or CMP (chemical mechanical polishing) step is then carried out to planarize the upper surface as shown in FIG. 16C.

A non-critical alignment step is then carried out to protect the thick oxide 50 over the common conduction regions 35 and the wider portion of oxide layer 50 is etched as shown in FIG. 16D. The processing then continues as shown in FIGS. 6 through 13.

Figure 17:
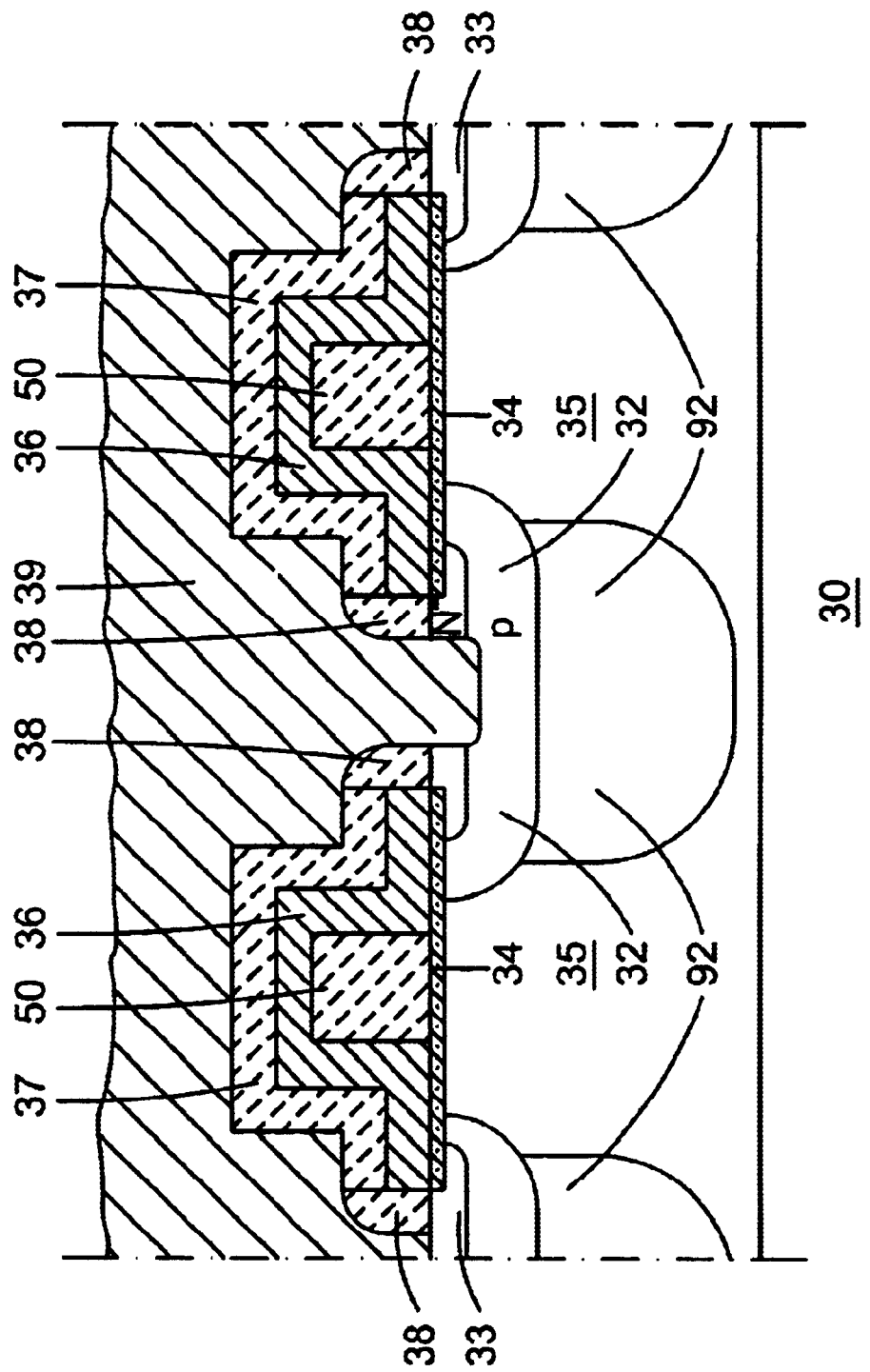
FIG. 17 shows a cross-sectional view of a device according to a third embodiment of the present invention.
Figure 18:
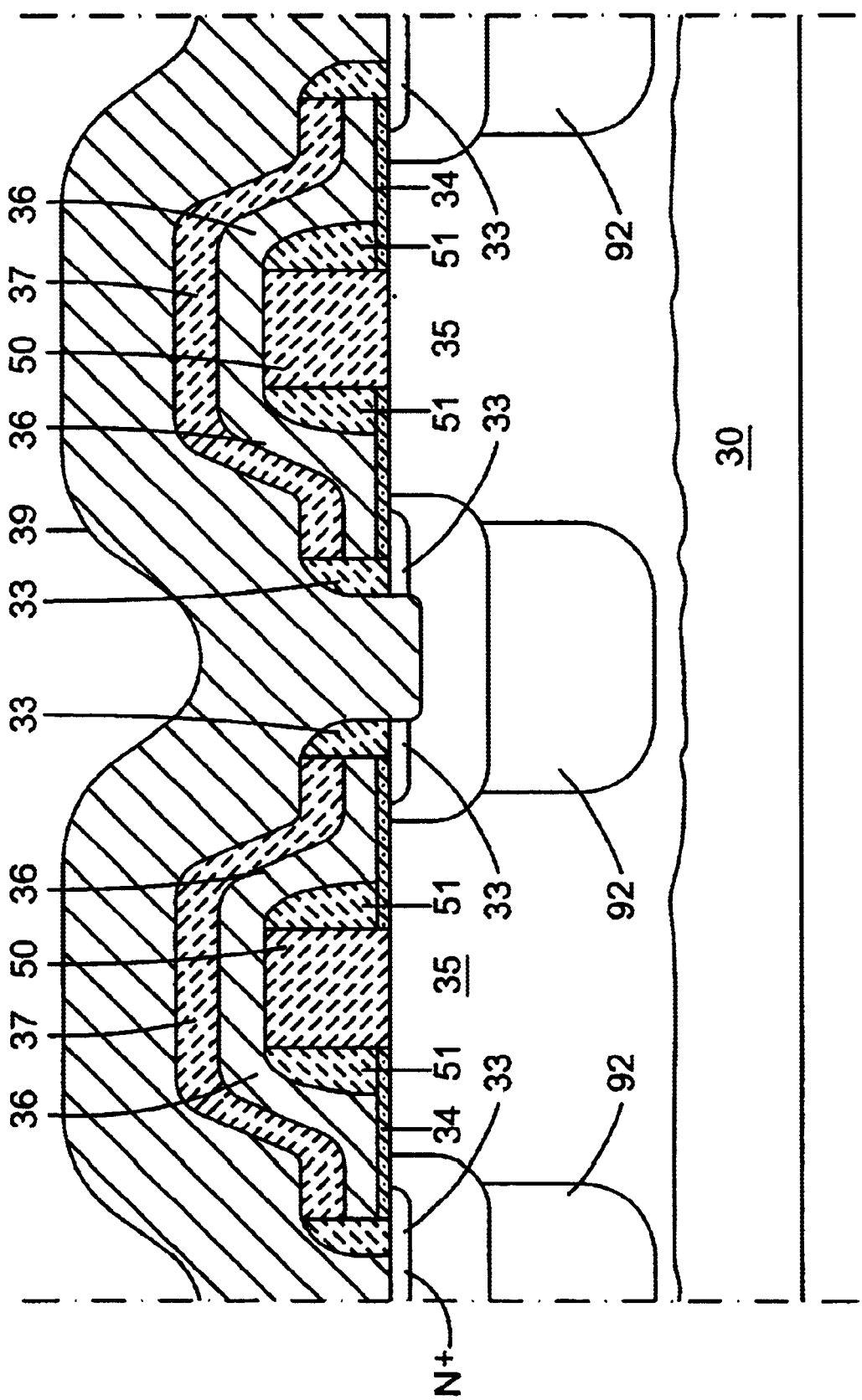
FIG. 18 shows a cross-sectional view of a device according to a fourth embodiment of the present invention.

Other embodiments of the present invention are also possible. For example, FIG. 17 shows a device according to the third embodiment which includes polysilicon gate electrodes 36 that extend over the oxide spacers 50. Also, FIG. 18 shows a fourth embodiment in which the third embodiment is modified to include sidewall spacers 51 located at respective vertical sides of the oxide spacers 51.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A power semiconductor device comprising:

a substrate of a first conductivity type;

an epitaxial layer of a first conductivity type formed on a surface of said substrate;

a plurality of lightly doped base regions of a second conductivity type formed to a first predetermined depth in said epitaxial layer, said base regions being spaced from one another;

common conduction regions disposed between said base regions;

a plurality of highly doped source regions of the first conductivity type formed in said lightly doped base regions;

invertible channel regions disposed between said source regions and said common conduction regions;

deep implanted junctions of said second conductivity type formed in said epitaxial layer under said base regions extending between said first predetermined depth to a second predetermined depth;

gate electrodes formed over said invertible channels, said gate electrodes being insulated from said invertible channels by an insulation layer; and thick insulation spacers disposed over at least a portion of said common conduction regions.

2. The power semiconductor device of claim 1, wherein said gate electrodes are disposed on the sides of said thick insulation spacers.

3. The power semiconductor device of claim 1, further comprising a contact layer electrically connected to said source regions.

4. The power semiconductor device of claim 3, wherein said contact layer is electrically connected to said source regions and said base regions.

5. The power semiconductor device of claim 1, wherein said gate electrodes comprise of polysilicon.

6. The power semiconductor device of claim 1, wherein an insulating structure is formed over said gate electrodes.

7. The power semiconductor device of claim 1, further comprising insulating spacers formed on the sides of said gate electrodes.

8. The power semiconductor device of claim 1, further comprising insulating layers formed over said gate electrodes.

9. The power semiconductor device of claim 1, wherein said second predetermined depth is at least twice as deep as said first predetermined depth.

10. The power semiconductor device of claim 1, wherein said second predetermined depth is about the thickness of said epitaxial layer.

11. A power semiconductor device comprising:

a substrate of a first conductivity type;

an epitaxial layer of a first conductivity type formed on a surface of said substrate;

a plurality of lightly doped based regions of a second conductivity type formed to a first predetermined depth in said epitaxial layer, said base regions being spaced from one another;

common conduction regions disposed between said base regions;

a plurality of highly doped source regions of the first conductivity type formed in said lightly doped base regions;

invertible channel regions disposed between said source regions and said common conduction regions;

deep implanted junctions of said second conductivity type formed in said epitaxial layer under said base regions extending between said first predetermined depth to a second predetermined depth;

gate electrodes formed over said invertible channels, said gate electrodes being insulated from said invertible channels by an insulation layer; insulating spacers formed on the sides of said gate electrodes; and a layer of polysilicide disposed between said insulating spacers and said gate electrodes.

* * * * *